United States Patent [19]
Leibman

[11] Patent Number: 5,289,543
[45] Date of Patent: Feb. 22, 1994

[54] FM RECEIVER AND COMMUNICATION SYSTEMS INCLUDING SAME

[75] Inventor: Vadim Leibman, Migdal Haemek, Israel

[73] Assignee: AVR Communications Ltd., Haifa, Israel

[21] Appl. No.: 471,747

[22] Filed: Jan. 25, 1990

[30] Foreign Application Priority Data

Feb. 10, 1989 [IL] Israel ........................... 89259

[51] Int. Cl.⁵ ............................................... H04H 5/00
[52] U.S. Cl. ........................................... 381/7; 329/343
[58] Field of Search .................. 381/3, 13, 4, 14, 7; 329/343

[56] References Cited

U.S. PATENT DOCUMENTS

| | | | |
|---|---|---|---|
| 3,029,313 | 4/1962 | Crosby | 381/3 |
| 3,099,800 | 7/1963 | Vinson et al. | 329/343 |
| 3,462,688 | 8/1969 | Abel | 381/77 |
| 3,502,995 | 3/1970 | Cottatellucci et al. | 329/343 |
| 3,586,980 | 6/1971 | Krausser . | |
| 3,934,201 | 1/1976 | Majefski | 381/14 |
| 3,985,977 | 10/1976 | Beaty et al. | 455/66 |
| 4,426,727 | 1/1984 | Hamada | 381/13 |
| 4,511,849 | 4/1985 | Yoshihisa et al. . | |
| 4,558,284 | 12/1985 | Zaidenweber | 329/343 |

FOREIGN PATENT DOCUMENTS 0296092 12/1988 European Pat. Off. ............ 381/79
2067860 7/1981 United Kingdom .

OTHER PUBLICATIONS

National Semiconductor, AN20, Feb. 1969, p. AN20-4.
Lancaster, CMOS cookbook, 1979, pp. 221-225.

Primary Examiner—Forester W. Isen
Attorney, Agent, or Firm—Benjamin J. Barish

[57] ABSTRACT

An FM receiver includes an FM discriminator having a comparator for converting the FM signal to a series of discrete square-wave pulses all of the same amplitude and of a repetition rate varying with the frequency of the FM signals; and an integrator circuit which integrates the series of monopolar square-wave pulses to produce an output signal having an amplitude varying with the repetition rate of the square-wave pulses. Also described are FM stero systems including the above FM discriminator in its audio channels.

16 Claims, 8 Drawing Sheets

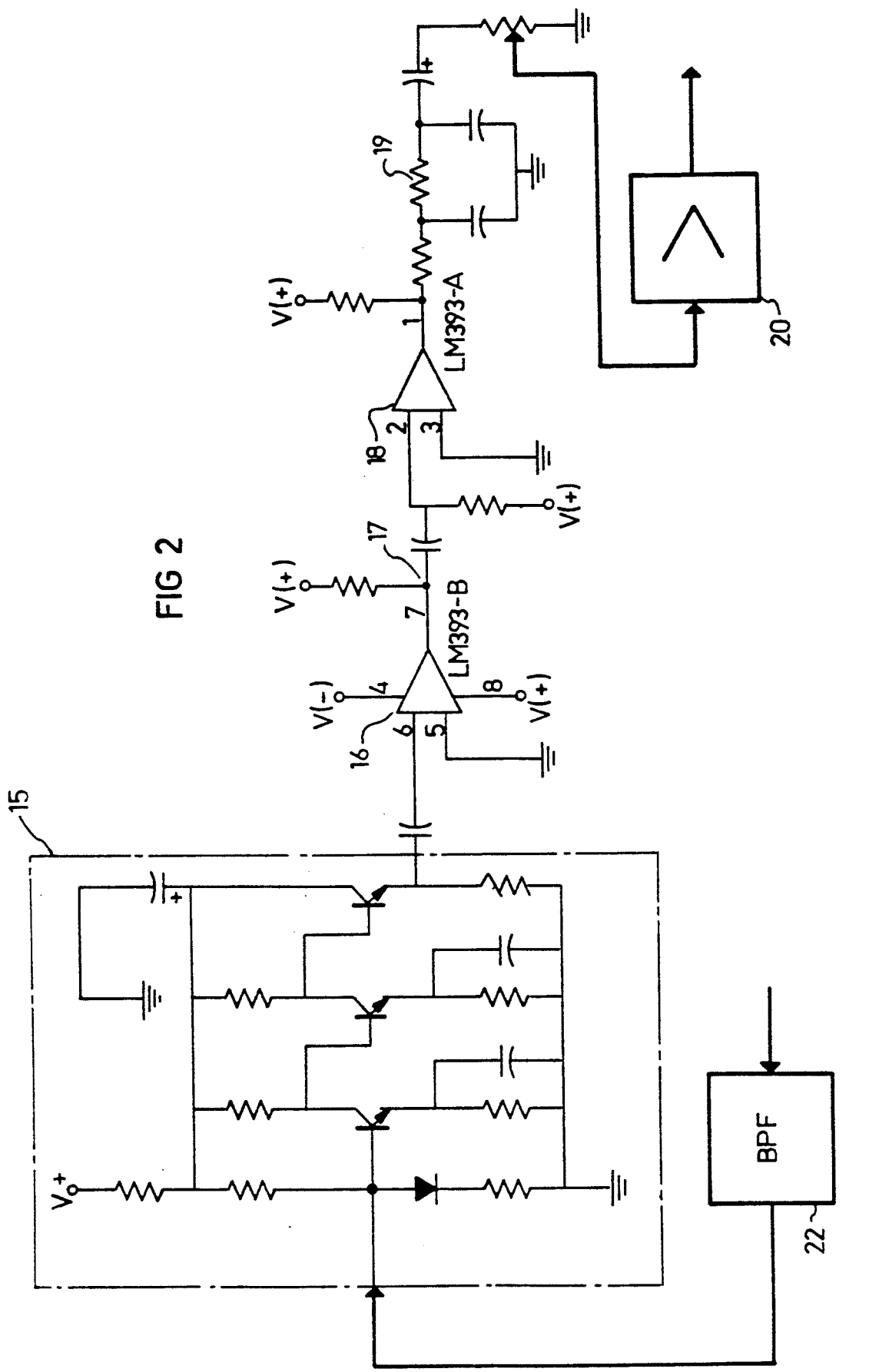

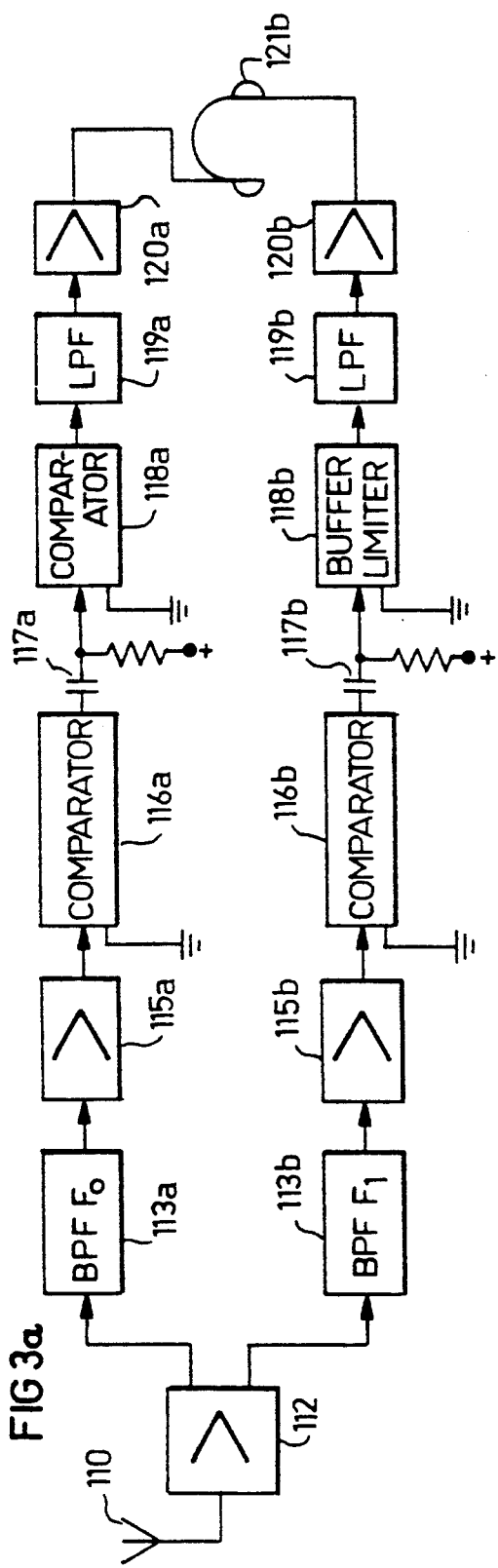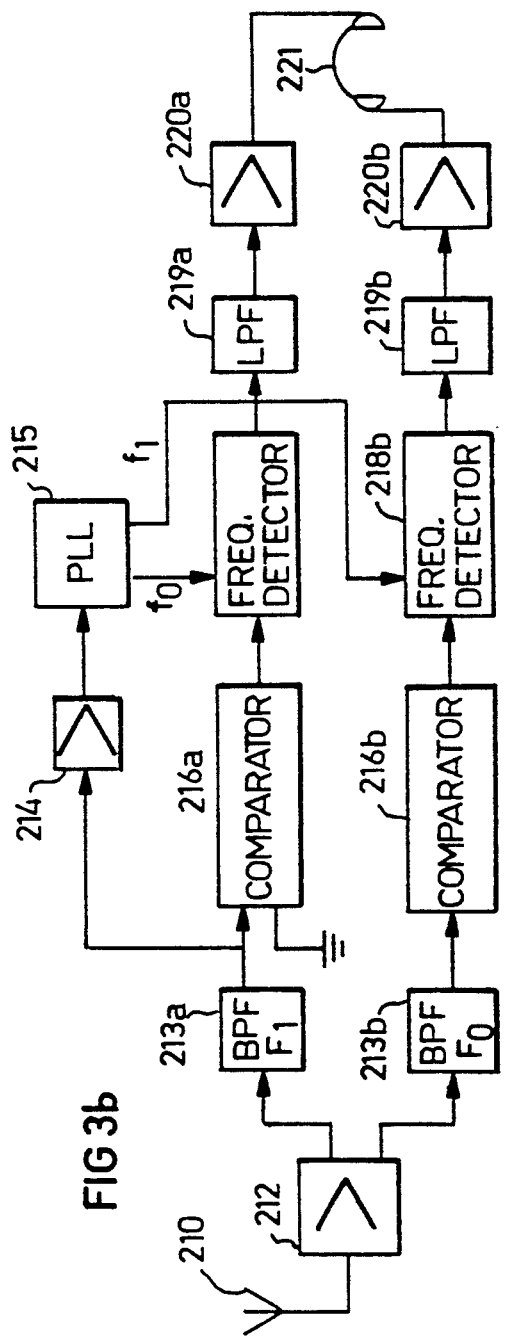

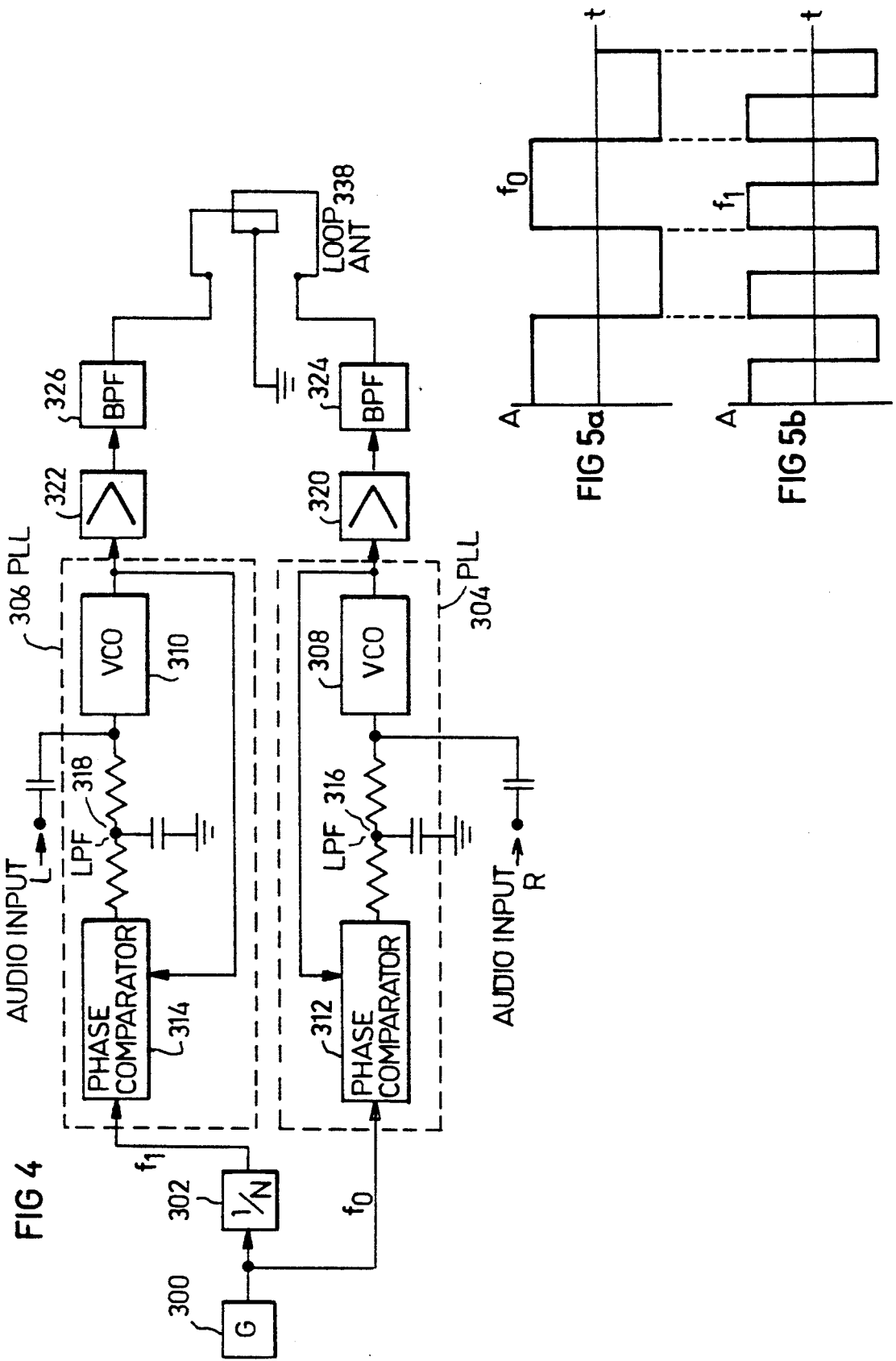

1

FM RECEIVER AND COMMUNICATION SYSTEMS INCLUDING SAME

BACKGROUND OF THE INVENTION

The present invention relates to an FM receiver, and also to FM communication systems including such a receiver. The invention is particularly adaptable for miniaturization since it requires very little power, thereby making it eminently suitable for use as an earplug or earphone in a hearing aid, hands-free receiver, or the like.

In FM communication, the frequency of a carrier of fixed amplitude is varied above and below the normal carrier frequency in accordance with the signal to be transmitted. The FM receiver must therefore also include an FM discriminator producing an output voltage varying with the frequency of the received FM signal. This output voltage is used as the audio signal for producing the sounds in an audio system.

The FM receiver also includes a limiter for limiting the amplitude of the received FM signal. In the conventional FM receiver, the limiter is usually an amplifier which is driven to saturation. Such conventional systems therefore consume considerable energy, which requires the use of larger batteries, or the more frequent replacement of the batteries, neither of which is desirable when the receiver is embodied in an earplug or earphone such as used in hearing aids, hands-free communication, or the like.

OBJECTS AND BRIEF SUMMARY OF THE INVENTION

One object of the present invention is to provide an FM receiver which requires substantially less energy than the conventional FM receiver.

Another object of the invention is to provide an FM receiver of relatively simple construction which, together with its low energy requirements, makes it particularly suitable for miniaturization and for incorporation in an earplug or earphone.

A further object of the present invention is to provide novel forms of FM stereo communication systems.

A still further object of the invention is to provide an FM communication system particularly adaptable for mounting on the body of the user so as to serve as a hearing aid for those having hearing impairments, or to permit hands-free communication.

According to one aspect of the present invention, there is provided an FM receiver including an FM discriminator producing output signals varying with the frequency of the received FM signals, characterized in that the FM discriminator comprises: a comparator for converting the FM signals to a series of discrete square-wave pulses of the same amplitude and having a repetition rate varying with the frequency of the FM signals, to thereby produce bipolar pulses having the same amplitude and having a repetition rate varying with the frequency of the FM signals; an RC-differentiator circuit for converting the bipolar square-wave pulses from the first comparator to bipolar spike-shaped pulses having a fast rise time and a fall time determined by the RC value of the differentiator circuit; a second comparator for converting the spike-shaped pulses from the differentiator circuit to monopolar square-wave pulses having the same amplitude, the same pulse width determined by the rise and fall times of the spike-shaped pulses, and a repetition rate varying with the frequency of the FM signals; and an integrator circuit for integrating the series of discrete square-wave pulses to produce the output signals having an amplitude varying with the repetition rate of the monopolar square-wave pulses.

An FM receiver may be constructed in accordance with the foregoing features to consume considerably less energy than the conventional FM receiver using a discriminator of the saturable amplifier type for limiting the amplitude of the FM signal. This enables the FM receiver to be miniaturized and to use smaller batteries requiring infrequent replacement. It has also been found that an FM receiver constructed in accordance with the foregoing features provides more linear processing of the received FM signal, and better rejection of interference.

According to another aspect of the present invention, there is provided an FM stereo communication system in which the transmitter transmits the two audio signals in two separate channels having carriers which differ in frequency by a factor of "2" or a whole number multiple thereof. In another described embodiment, the transmitter transmits the two audio signals in two separate channels having carriers which differ in frequency according to a predetermined constant relation, and include filtering means for preventing negative effects of harmonics therebetween. A still further embodiment is described in which the transmitter transmits only a single carrier, and modulates the carrier at a relatively high frequency with one audio signal, and at a relatively low frequency with the other audio signal.

According to a further aspect of the present invention, there is provided a communication system including an FM transmitter having means for mounting it on the body of a person, and an FM transmitting antenna for transmitting the signals; and a receiver having means for mounting it in or adjacent to the ear of the person and including a receiving antenna for receiving the transmitted signals and for converting them to audio signals; characterized in that the FM transmitter operates at a frequency of up to several hundred KHz, and its transmitting antenna is in the form of a loop wound around the person's body to produce a reception region substantially confined to that occupied by the person.

According to a still further aspect of the invention, there is provided a communication system including an FM transmitter for transmitting signals via a transmitting antenna and an FM receiver for receiving the signals via a receiving antenna and for converting them to audio signals, the receiver being mounted in or adjacent to the ear of a person; characterized in that the FM transmitter transmits a modulated carrier signal having a frequency of up to several hundred KHz, and in that the transmitting antenna is in the form of a loop wound around the walls of an enclosure to produce a reception region substantially confined to the enclosure.

Apparatus constructed in accordance with the latter features produce spatially limited transmissions, which enable a plurality of similar devices operating at the same frequency, but with different information content, to be used by separate users in relative closeness without producing undesired crosstalk.

Still further features and advantages of the invention will be apparent from the description below.

BRIEF DESCRIPTION OF THE DRAWINGS

The invention is herein described, by way of example only, with reference to the accompanying drawings, wherein:

FIG. 2 is a circuit diagram illustrating one implementation of the FM receiver of FIG. 1;

FIGS. 3a and 3b are block diagrams illustrating two stereo FM receivers constructed in accordance with the present invention;

FIG. 4 is a block diagram illustrating a stereo FM transmitter circuits, that may be used with the receiver of FIGS. 3a or 3b;

FIGS. 5a and 5b are waveforms useful in understanding the operation of the transmitter of FIG. 4;

DESCRIPTION OF PREFERRED EMBODIMENTS

Basic FM Receiver

Figure 1:
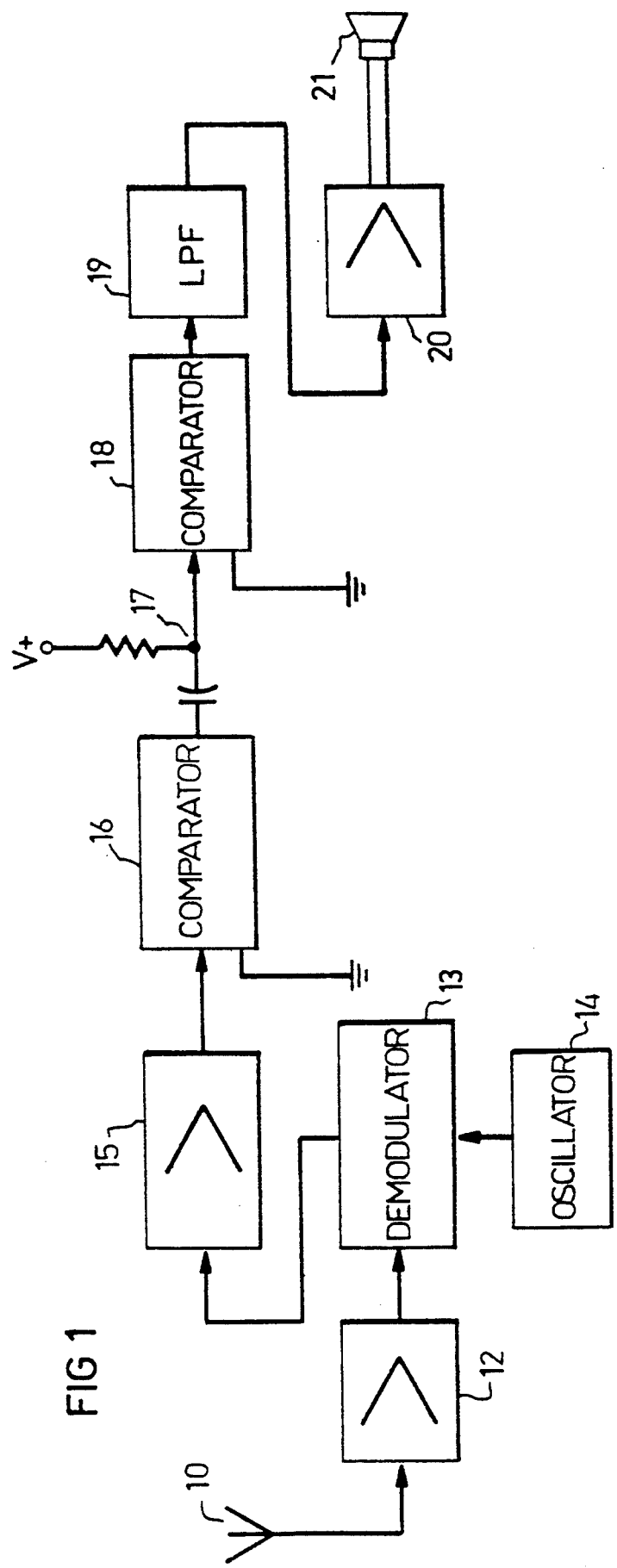
FIG. 1 is a block diagram illustrating one form of FM receiver constructed in accordance with one aspect of the present invention.

FIG. 1 illustrates the main components of an FM receiver constructed in accordance with one preferred embodiment of the present invention.

As shown in FIG. 1, the FM signals are picked up by an antenna 10, and are passed to an input stage amplifier 12. The output of amplifier 12 is applied to a demodulator 13 which shifts the RF carrier frequency to an intermediate frequency, as controlled by oscillator 14. The output of modulator 13 is supplied via an intermediate frequency amplifier 15 to a high-speed comparator 16, which converts the FM signal to a series of discrete square-wave bipolar pulses all of the same amplitude, and having a repetition rate varying with the frequency of the received FM signal.

Figure 1A:
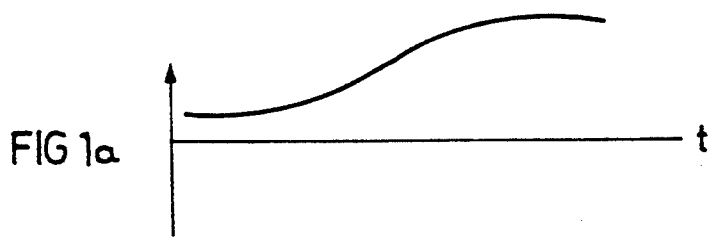
FIGS. 1a–1f are waveforms helpful in understanding the operation of the FM receiver of FIG. 1.
Figure 1B:
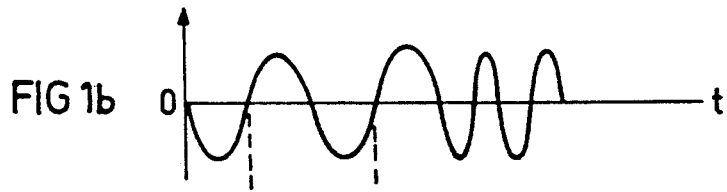

FIG. 1a illustrates the original audio signal used in the transmitter for frequency-modulating the carrier wave received by the receiver antenna; and FIG. 1b illustrates the frequency modulated signal as received by the antenna 10, after having been reduced in frequency to the intermediate frequency by demodulator 13, and amplified by amplifier 15, before inputted into the comparator 16.

Figure 1C:
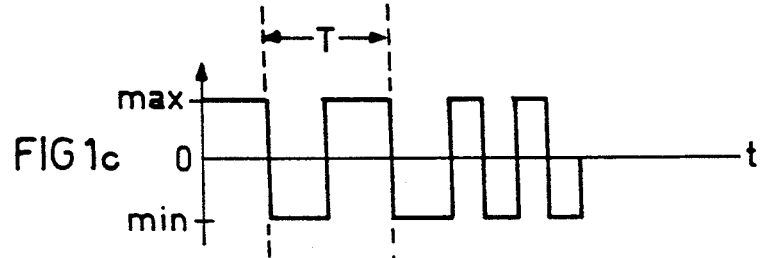

FIG. 1c illustrates the output of the comparator 16 is a device which compares the FM signals and produces an output of a first level when a received FM signal is above a predetermined amplitude threshold, and of a second level when a received FM signal is below the predetermined amplitude threshold; in the example illustrated in FIG. 1c, the predetermined amplitude threshold is the 0-crossover point of the input FM signal. It will thus be seen that the output is in the form of a series of bipolar square-wave pulses each having two discrete values, namely +1 and −1, and having a repetition rate equal to the frequency of the FM signal of FIG. 1b. Preferably, a high-speed comparator is used.

Figure 1D:
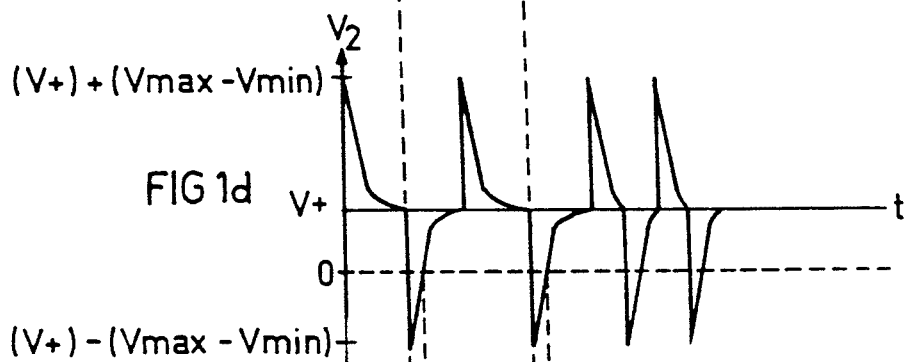
Figure 1E:
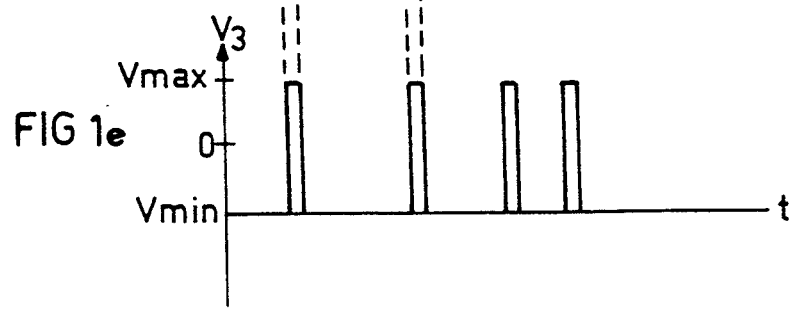

The square-wave pulses from comparator 16 are applied to a differentiator circuit 17 which converts the square-wave pulses to bipolar spike-shaped pulses having a fast rise time and a fall time determined by the RC values of the RC-differentiator circuit 17 as shown in FIG. 1d. The latter pulses are applied to another high-speed comparator, which reconverts the spike-shaped pulses to monopolar square-wave pulses, as shown in FIG. 1e. Such pulses are all of the same amplitude of the same pulse width as determined by the rise and fall times of the spike-shaped pulses from the differentiator circuit 17, and have a repetition rate varying with the frequency of the original FM signal.

The spike-shaped pulses created by the combination of the comparator 16 and the differentiator 17 define the start and the end of the monopolar pulses produced by the second comparator 18. This will be clear from FIGS. 1b–1e. Thus, FIB. 1b illustrates the incoming FM signal (shown as a sine waveform with frequency f=1/T), which is fed to the first comparator 16. The bipolar pulses produced by the first comparator 16 are illustrated in FIG. 1c, wherein it will be noted that V+ (FIG. 1) determines $V_{max}$.

FIG. 1d illustrates the spike-shaped pulses at the output of the differentiator circuit 17. Because the first comparator 16 is a high speed comparator, the rise time of the spike-pulses is extremely short and is therefore negligible; the fall time, however, is controlled by the RC values of the differentiator circuit.

The spike-shaped pulses illustrated in FIG. 1d are fed to the second comparator 18, which produces an output as illustrated by the waveform in FIG. 1e.

As can be seen from FIG. 1, one node of the resistor in the differentiator circuit is connected to V+ and therefore only the negative spike-shaped pulses cross zero (0). Since zero is the threshold for the second comparator, it is clear that only the negative spike-shaped pulses change the state of the second comparator 18. This change of state occurs twice: first, on the pulse rise, and then on the pulse fall when it cross the zero threshold. These two points in time determine the pulse width as shown in FIG. 1e. In other words, the width of the pulses from the second comparator 18 is constant and its duration depends on the values of R and C in the differentiator circuit 17.

Figure 1F:
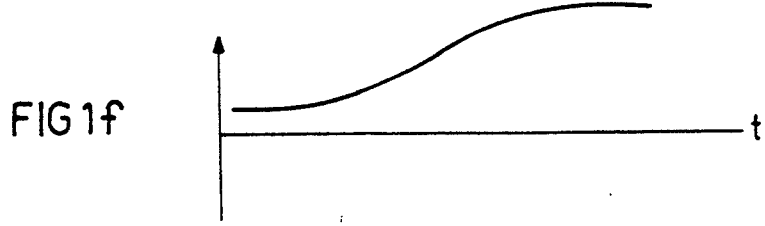

The pulses outputted from comparator 18 are now fed to an integrator circuit, in the form of a low-pass filter 19. This circuit integrates the square-wave pulses of FIG. 1e to produce an output signal, as shown in FIG. 1f, having an amplitude varying with the repetition rate of the square-wave pulses. The output signal from low-pass filter 19 represents the original audio signal, which is amplified by an output stage amplifier 20 and fed to the speaker 21.

It will thus be seen that the original audio signal illustrated in FIG. 1a, used for frequency-modulating the carrier wave in the transmitter, is reproduced in the receiver as shown in FIG. 1f and, after suitable amplification, is used for driving the speaker 21. The circuit elements used for reproducing this audio signal in the receiver, namely the comparator 16, differentiator 17, comparator 18, and low-pass filter 19, all have very low energy requirements, as compared to saturable amplifiers used in conventional FM receivers. Accordingly, the FM receiver illustrated in FIG. 1 requires considerably less energy than a conventional FM receiver, thereby enabling the use of a smaller battery in the FM receiver, and/or its replacement at less frequent intervals, as compared to a conventional FM receiver.

Moreover, it was found that the circuit illustrated in FIG. 1 exhibits a more linear processing of the FM signal, and a better rejection of interferences.

Figure 1G:
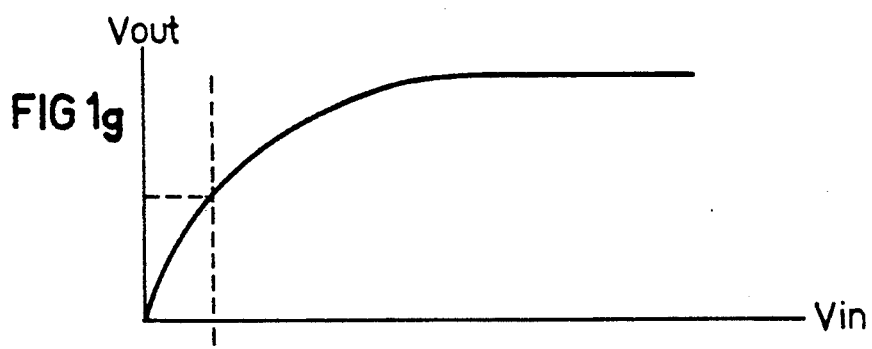
FIGS. 1g, 1h and 1i are waveforms helpful in understanding some of the benefits provided by the FM receiver of FIG. 1.
Figure 1H:
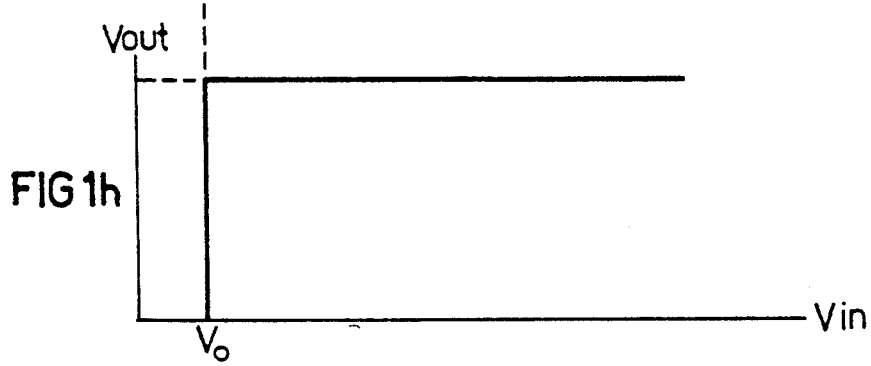
Figure 1I:
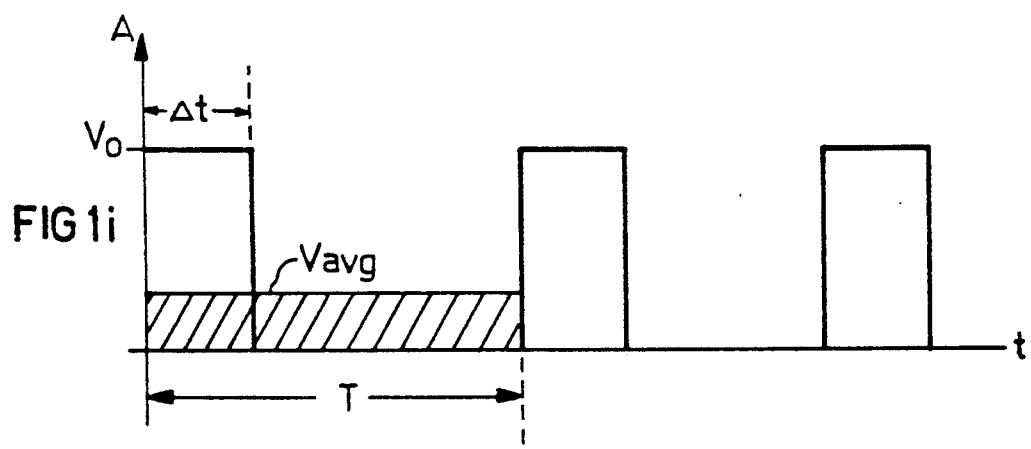

These advantages will be better understood by reference to the waveforms of FIGS. 1g-1i.

Thus, FIG. 1g illustrates the output voltage of an intermediate frequency amplifier in a standard FM receiver with respect to the input voltage, whereas FIG. 1h illustrates the same relationship when using the comparator limiter arrangement illustrated at 16 in the circuit of FIG. 1. Thus, the comparator limiter arrives to the amplitude threshold at point $V_0$ at which the IF amplifier in the conventional FM receiver does not provide full limiting. This features reduces the effect of noise on the amplitude and phase of the FM signal. FIG. 1i illustrates the waveform at the output from the FM discriminator (namely the waveform illustrated in FIG. 1e), and the integral of this waveform ($V_{avg}$) after integration by the lowpass filter, which integral value ($V_{avg}$) is the amplitude of the audio signal. The constant $\Delta t$ is the pulse timing; and the value T is the time period of the intermediate frequency.

It will be seen that the average voltage ($V_{avg}$) varies as a function of time T according to the following relation:

$$V_{avg} = V_0 \cdot \Delta t / T \qquad (1)$$

The time period of the intermediate frequency varies as a function of frequency (f), as follows:

$$T = 1/f \qquad (2)$$

Since $\Delta t$ is a constant valve, it will be seen that a linear relationship exists between the audio signal $V_{avg}$ and f, as follows:

$$V_{avg} = V_o \cdot \Delta t \cdot f \qquad (3)$$

This is to be distinguished from the discriminators in a convention FM receiver, generally including an LC circuit, which is inherently not linear for wide band.

All the foregoing characteristics of the illustrated FM receiver make it eminently suitable for miniaturization and for incorporation into an earplug or earphone mounted in or adjacent to the user's ear to provide wireless reception of the transmitted FM signals.

Examples of FM Receivers

FIG. 2 illustrates a preferred implementation of the major components of the basic FM receiver shown in the block diagram of FIG. 1, namely the amplifier 15, high-speed comparator 16, differentiator 17, comparator 18, low-pass filter 19, and audio amplifier 20. The circuit illustrated in FIG. 2 is actually one channel of a two channel stereo FM receiver, and therefore also shows a bandpass filter 22 at the input to the input stage amplifier 15 passing the frequency band of the respective channel.

FIG. 3a illustrates the two channels of one form of stereo FM receiver constructed in accordance with the invention. Thus, the FM signals are picked up by an antenna 110, and are passed through an input stage amplifier 112. The output of amplifier is supplied in parallel to bandpass filters 113a, 113b which pass respective carrier frequencies $F_0$, $F_i$ for the two stereo channels.

The outputs of the respective bandpass filters 113a, 113b are applied via amplifiers 115a, 115b to the respective high-speed comparators 116a, 116b, for the two stereo channels. As described above with respect to FIG. 1, each comparator is a bistable device which, as described earlier, converts the FM signal into a series of discrete square-wave pulses all of the same amplitude, and having a repetition rate varying with the frequency of the FM signal (as illustrated in FIG. 1c). The outputs of the respective comparators 116a, 116b are applied to differentiators 117a, 117b, which convert the square-waves into spike-shaped pulses (as illustrated in FIG. 1d). The latter pulses are applied, via buffer limiters 118a, 118b, to their respective low-pass filters 119a, 119b. Each buffer limiter is operative to decouple the differentiator from its respective low-pass filter, and also to perform a clipping function, outputting only monopolar (positive) pulses to the low-pass filter (as illustrated in FIG. 1e).

The low-pass filters 119a, 119b, as described earlier with respect to FIG. 1, are operative to integrate the square-wave pulses in the respective channel as a function of the "density" of the pulses received from the differentiator, to produce an output signal having an amplitude varying with the repetition rate of the pulses (as illustrated in FIG. 1f). The latter output signals correspond to the original audio signals in the transmitter, and are applied to output stage amplifiers 120a, 120b, and then to the transducers 121a, 121b, e.g., in an earphone headset 121.

FIG. 3b illustrates the construction of another stero FM receiver in accordance with the present invention. As in the embodiment of FIG. 3a, the FM signals are picked up by an antenna 210, and are passed through an input stage amplifier 212. The output of amplifier 212 is supplied in parallel to two bandpass filters 213a, 213b, which pass carrier frequencies $F_0$, $F_1$ of the two stereo channels. Carrier frequency $F_0$ is the basic carrier frequency, and carrier frequency $F_1$ is equal to $F_0/n$, wherein "n" is "2" or a whole multiple thereof.

The outputs of the bandpass filters 213a, 213b are supplied to respective comparators 216a, 216b which output discrete square-wave pulses at a repetition rate corresponding to the frequency of the respective FM signal. The output of bandpass filter 213a is also supplied, via an amplifier 214, to a PLL (phase-locked loop) 215. Since the ratio between the frequencies $F_0$ and $F_1$ of the respective carriers is a known constant, the PLL 215 can lock on both carrier frequencies using only the frequency $F_1$, and an internal multiplication function which multiplies the $F_1$ frequency by the factor "n" to provide $F_0$. This $F_1$ reference replaces the pilot signal used in conventional FM receivers.

The $F_1$ and $F_0$ signals are supplied to respective frequency detectors 218a, 218b which output signals proportional to the ratio between the IF from the comparator, and the frequency $F_0$, $F_1$, from the PLL. The outputs of the frequency detectors 218a, 218b are integrated by their respective low-pass filters 219a, 219b, and are amplified in amplifiers 220a, 220b, before being fed to a transducer 221, such as a headset.

Examples of FM Transmitters

FIG. 4 illustrates a transmitter which may be used in the stereo FM communication system including the receiver of FIG. 3a or FIG. 3b. This transmitter comprises a generator 300 which outputs a basic carrier frequency $F_0$. A part of the output of generator 300 is supplied to a 1/N divider 302 which outputs a second carrier frequency $F_1$. The two carrier frequencies $f_0$ and $f_1$ differ in frequency by a factor of "N", where "N" may typically be "2". In such a case, the carrier frequency $f_0$ is represented by the waveform illustrated in FIG. 5a, while the carrier frequency $f_1$ is represented by the waveform illustrated in FIG. 5b. This selection of the relationship of the frequencies prevents otherwise troublesome intermodulation of harmonics.

The factor "N" may be a whole number multiple of "2". For example, if "N" is "4", the intermodulation of harmonics is at a very high frequency out of the audio band, so that when the carrier does not actually carry an audio signal, no noise is heard.

The two carrier frequencies $f_0$ and $f_1$ are fed to the respective PLL 304, 306. Each PLL comprises a VCO (voltage controlled oscillator) 308, 310, a phase comparator 312, 314, and an external low-pass filter 316, 318.

The two stereo audio channels, labelled R and L, are fed to the respective PLL 304, 306 at the input to its VCO 308, 310, and are frequency modulated. The PLL's are operative to cause the average frequency of the FM signal at the output of VCO 308 in PLL 304 to be equal to the basic carrier frequency $f_0$, and to cause the average frequency of the FM signal at the output of VCO 310 in PLL 306 to be equal to the second carrier frequency $f_1$.

Following amplification by the respective amplifiers 320, 322, and filtering through the respective bandpass filters 324, 326, the outputs of the PLL's 304 and 306 are transmitted via antenna 328. This is preferably a loop antenna, as described below with respect to FIG. 7.

Single-Carrier Transmitter and Receiver

Figure 6A:
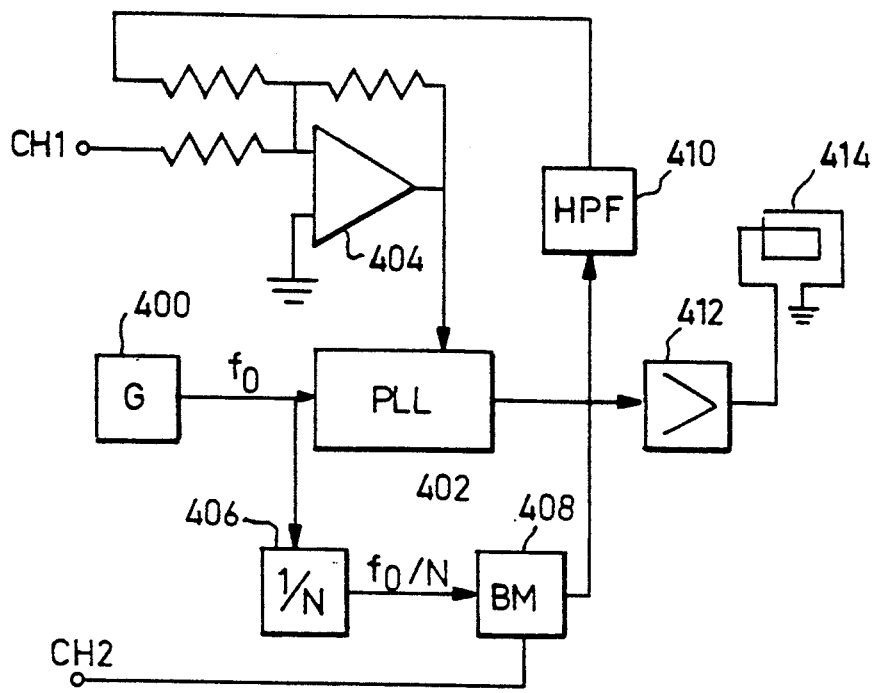
FIGS. 6a and 6b another form of transmitter and receiver circuit, respectively, which may be used.
Figure 6B:
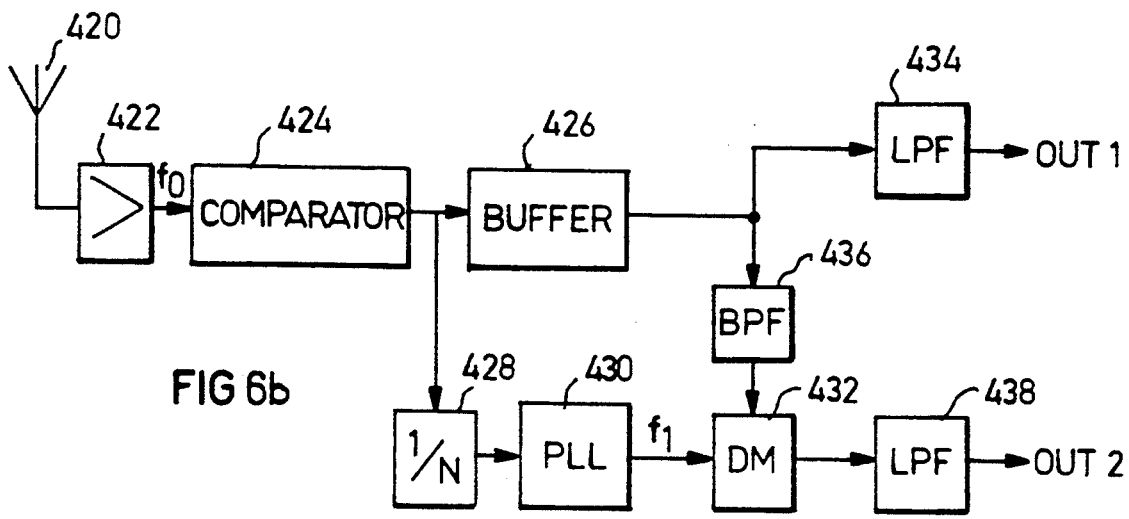

FIGS. 6a and 6b respectively illustrate another form of transmitter and receiver which may be used in an FM stero communication system constructed in accordance with the invention. In this system, the transmitter (FIG. 6a) transmits only a single carrier and modulates the carrier at a relatively high frequency with one audio signal, and at a relatively low frequency with the other audio signal.

More particularly, the transmitter illustrated in FIG. 6a includes a generator 400 providing a basic frequency $f_0$, typically in the range of 80-120 KHz, for a carrier to a PLL 402. A first audio channel $CH_1$ is fed through an amplifier 404 to provide a first frequency modulation of the carrier. The output of generator 400 is also supplied to a 1/N divider 406, where "N" is typically "4", so that the resulting signal, having a frequency of $F_0/N$, is typically above the audio spectrum. This signal is fed to a balanced modulator 408, which is modulated by the audio signal from the second audio channel $CH_2$. The balanced modulator 408 provides two spectral ranges at the signal output thereof. The output is supplied to a high-pass filter 410, which passes only the higher spectral range to amplifier 404.

Amplifier 404 provides to PLL 402 a summation of the first audio channel $CH_1$ having an audio frequency, and the second audio channel $CH_2$ which has been shifted to a higher frequency. The second audio channel is expressed as a second, higher frequency, frequency modulation. The output of PLL 402 thus contains the information of audio channel $CH_1$ as a relatively low frequency FM, and the information of audio channel $CH_2$ as a relatively high frequency FM. This output is supplied via an output stage amplifier 412 to a transmitting antenna 414 which, as described below with respect to FIG. 7, may preferably be a loop antenna.

The receiver illustrated in FIG. 6b is a single-carrier FM receiver useful with the transmitter illustrated in FIG. 6a. Its receiving antenna 420 is connected to a single input stage amplifier 422, a comparator 424, and a buffer 426. The treatment of the first audio channel is generally similar to that described above, particularly with reference to FIGS. 1 and 3a. The second channel is treated as follows:

Comparator 424, receives the input signal and converts it to a series of discrete bipolar square-wave pulses having the same amplitude and having a repetition rate varying with the frequency of the FM signals. Divider 428 is operative to divide the frequency of the square-wave pulses by a factor of "N", and to feed its output to PLL 430. The PLL 430 provides a signal having an average frequency $F_1$, which is equal to $F_0/N$, to a demodulator 432.

The buffer limiter 426 also receives the output from comparator 424 and provides an output having two spectral ranges. The output of buffer limiter 426 is integrated in a low-pass filter 434 which provides the audio information, corresponding to stereo channel $CH_1$ (FIG. 6a), to an output stage. A bandpass filter 436 provides high frequency information associated with the stereo channel $CH_2$ (FIG. 6a) to the demodulator 432. The demodulator 432 shifts by means of frequency $f_1$, the information back to the audio spectrum and integrates the output via a low-pass filter to the second stereo channel output stage.

Body-Mounted Communication Systems

Figure 7:
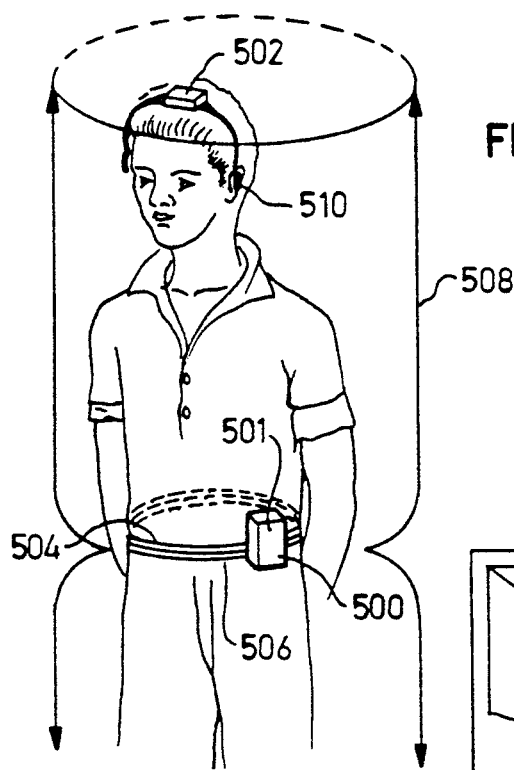
FIG. 7 is a pictorial illustration of a bodymounted FM communication system in accordance with the present invention.

FIG. 7 illustrates a stereo FM communication system, including a body-mounted audio device 500 incorporating an FM transmitter 501, and a receiver 502 mounted at the ear level of the person so as to produce a body worn communication system for wireless reception from an audio device.

Thus, as shown in FIG. 7, the audio device 500 including the transmitter 501 (e.g., one of those described above) is mounted on a belt 504 worn by the user. Belt 504 also includes a loop antenna 506 wound around the belt so as to produce a reception region, illustrated graphically as a generally cylindrical volume 508, which encloses the user's body.

The receiver 502 is mounted on a headset 510 worn by the user so as always to be located within the reception region 508. The headset 510 may of course be any type of earphone including any suitable audio transducer.

The wireless earphone arrangement illustrated in FIG. 7 may be used for any desired purpose, such as audio entertainment, hands-free communication, or as an assistance for a hearing impaired person.

Figure 8:
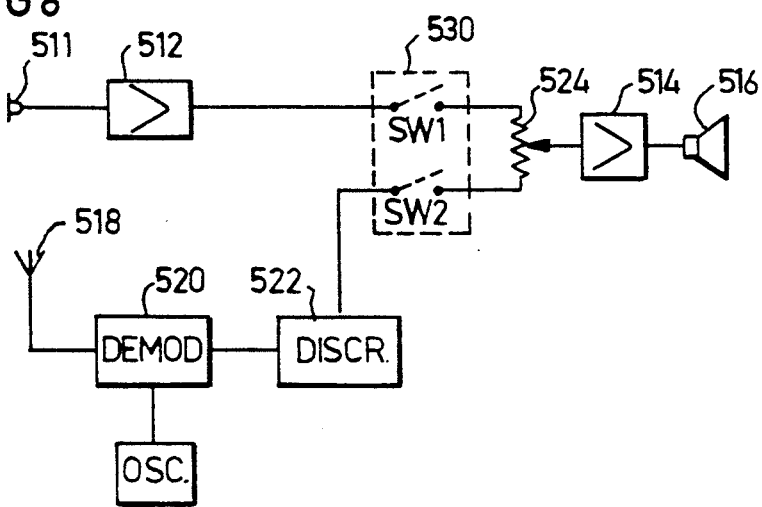
FIG. 8 illustrates a three-way hearing-aid and FM receiver which may be constructed in accordance with the invention.

FIG. 8 illustrates a receiver particularly useful as an ear level auditory training device for a hearing impaired person or for hands-free communication. The receiver illustrated in FIG. 8 includes a microphone 511 for picking up the environmental sounds, and an amplifier 512 for amplifying the sounds before feeding them, via an output stage amplifier 514, to the transducer 516.

The receiver illustrated in FIG. 8 further includes an antenna 518 for receiving the transmitted FM signals, a demodulator 520 for demodulating them, and a discriminator 522, corresponding for example to the circuit illustrated in FIG. 1, for detecting the modulating audio signals and for feeding them via a mixer 524 and the output stage amplifier 514, to the transducer 516.

The system illustrated in FIG. 8 further includes a three-position selector switch 530 connected to a pair of switches $SW_1$, $SW_2$, so as to control the input signals to the mixer 524 fed to the transducer 516. Thus, selector switch 530 includes: a first position which closes switch $SW_1$ to connect the microphone 510 to the transducer 516; a second position which closes switch $SW_2$ to connect the FM receiver circuit to the transducer 516; and a third position to connect both the microphone and the FM receiver to the transducer. Mixer 524 is adjustable to adjust the levels of the two signals.

The system illustrated in FIG. 8 may be used as a conventional hearing aid by moving selector switch 530 to close switch $SW_1$, thereby connecting microphone 510 via the amplifiers to the transducer 516. The system may also be used to amplify both the sounds picked up by the microphone 510 and the FM signals received by the FM receiver antenna 518, by moving selector switch 530 to close both switches $SW_1$, $SW_2$. The system can also be used simply as an FM receiver (for example, where there is considerable background noise that would normally be picked up by the microphone 510) by merely moving the selector switch 530 to close switch $SW_2$, wherein only the FM receiver circuit is connected to the transducer 516.

Figure 9:
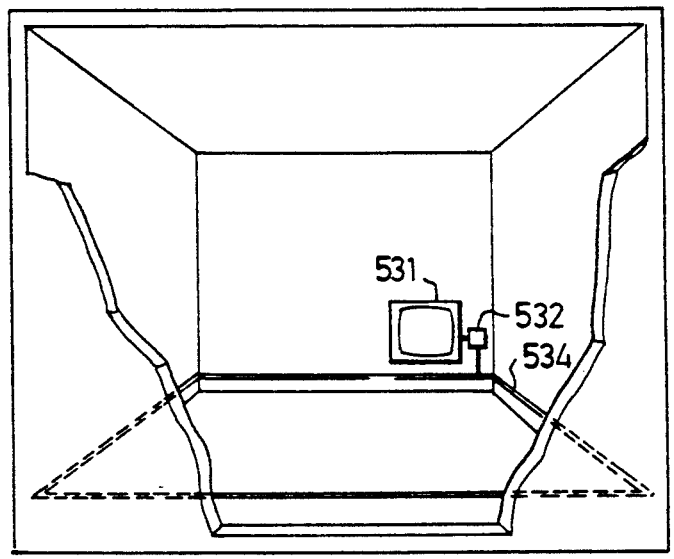
FIG. 9 pictorially illustrates an FM transmitter and receiver in accordance with the invention in which the reception region of the transmitted FM signal is substantially confined to a room enclosure.

FIG. 9 illustrates a system which may be used in an enclosure, e.g., to produce a reception region substantially confined to a room or a plurality of rooms. One application for such a system is to assist a hearing-impaired person to hear the sound of a television receiver 531 located in the room. In such a case, the audio output of the television receiver is fed to an FM transmitter 532 which includes a loop antenna 534 wound around the walls of the room or rooms, or other enclosure, to produce a reception region substantially confined to such enclosure. The user located anywhere within the room and wearing a receiver, as described above with respect to FIG. 7, will thus receive the FM transmissions.

While the invention has been described with respect to several preferred embodiments, it will be appreciated that these are set forth merely for purposes of example only, and that many other variations, modifications and applications of the invention may be made.

What is claimed is:

1. An FM receiver including an FM discriminator producing output signals having an amplitude varying with the frequency of the received FM signals, characterized in that said FM discriminator comprises:
   a first comparator for converting the FM signals to a series of discrete square-wave pules of the same amplitude and having a repetition rate varying with the frequency of the FM signals;
   said comparator including a device which compares the FM signals and produces an output of a first level when a received FM signal is above a predetermined amplitude threshold, and of a second level when a received FM signal is below said predetermined amplitude threshold, to thereby produce bipolar pulses having the same amplitude and having a repetition rate varying with the frequency of the FM signals;
   an RC-differentiator circuit for converting the bipolar square-wave pulses from said first comparator to bipolar spike-shaped pulses having a fast rise time and a fall time determined by the RC value of said differentiator circuit;
   a second comparator for converting said spike-shaped pulses from the differentiator circuit to monopolar square-wave pulses having the same amplitude, the same pulse width determined by the rise and fall times of the spike-shaped pulses, and a repetition rate varying with the frequency of the FM signals;
   and an integrator circuit for integrating said series of discrete square-wave pulses to produce said output signals.

2. The FM receiver according to claim 1, wherein said integrator circuit is a low-pass filter.

3. The FM receiver according to claim 1, further including:
   an RF amplifier for amplifying the received FM signals;
   a demodulator for shifting the carrier frequency of the FM signals to an intermediate frequency; and
   an intermediate frequency amplifier for amplifying the FM signals from the demodulator before fed to the converter circuit.

4. A stereo FM receiver for receiving stereo FM signals; said FM receiver including two audio channels, one of said channels having a basic carrier frequency $F_0$ and the other of said channels having a carrier frequency $F_1$ which is equal to $F_0/n$, wherein "n" is a whole number, both of said channels including an FM discriminator according to claim 1.

5. The receiver according to claim 4, wherein "n" is "2".

6. An FM communication system including an FM transmitter for transmitting FM signals via a transmitting antenna, and an FM receiver according to claim 1 for receiving said FM signals via a receiving antenna and for converting them to audio signals.

7. The system according to claim 6, wherein said communication system is a stereo system in which said transmitter and receiver transmit and receive two audio signals.

8. The system according to claim 7, wherein said transmitter transmits two audio signals in two separate channels having carriers which differ in frequency by a factor which is a whole number multiple of "2".

9. The system according to claim 7, wherein said transmitter transmits the two audio signals in two separate channels having carriers which differ in frequency according to a predetermined constant relation and include filter means for preventing negative effects of harmonics therebetween.

10. The system according to claim 7, wherein said transmitter transmits only a single carrier and modulates said carrier at a relatively high frequency with one audio signal, and at a relatively low frequency with another audio signal.

11. The system according to claim 6, wherein said FM transmitter includes means for mounting it on the body of a person, and the FM receiver includes means for mounting it on or adjacent the ear of said person.

12. The system according to claim 11, wherein the carrier frequency of the transmitted FM signal is up to a few hundred KHz, and said transmitting antenna is in the form of a loop wound around the person's body to produce a reception region substantially confined to that occupied by said person.

13. The system according to claim 11, wherein the carrier frequency of the transmitted FM signal is up to several hundred KHz, and said transmitting antenna is in the form of a loop wound around the walls of an enclosure to produce a reception region substantially confined to said enclosure.

14. An communication system according to claim 6, wherein said receiver is mounted in or adjacent to the ear of a person, said Fm transmitter transmits an FM carrier having a frequency of up to a few hundred KHz, and said transmitting antenna is in the form of a loop wound around the walls of an enclosure to produce a reception region substantially confined to said enclosure.

15. A stereo communication system including an FM transmitter and an FM receiver; said FM transmitter including means for transmitting two audio signals in two separate channels having carriers which differ in frequency by a factor which is a whole number multiple of "2".

16. The system according to claim 15, wherein said receiver includes a bandpass filter for separating said two channels, and an FM discriminator circuit for each channel, each of said FM discriminator circuits comprising: a comparator for converting the FM signals to a series of discrete square-wave pulses of the same amplitude and having a repetition rate varying with the frequency of the FM signals; and an integrator circuit for integrating said series of discrete square-wave pulses to produce said output signals.

* * * * *